United States Patent
Bhat et al.

(10) Patent No.: US 6,876,008 B2
(45) Date of Patent: Apr. 5, 2005

(54) MOUNT FOR SEMICONDUCTOR LIGHT EMITTING DEVICE

(75) Inventors: Jerome C. Bhat, San Francisco, CA (US); Cresente S. Elpedes, San Jose, CA (US); Paul S. Martin, Pleasanton, CA (US); Serge L. Rudaz, Sunnyvale, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 10/632,719

(22) Filed: Jul. 31, 2003

(65) Prior Publication Data

US 2005/0023548 A1 Feb. 3, 2005

(51) Int. Cl.[7] .......................... H01L 29/22; H01L 33/00; H01L 29/207; H01L 29/227
(52) U.S. Cl. ............................ 257/99; 257/84; 257/93; 257/98
(58) Field of Search ............................ 257/81, 79, 84, 257/93, 98, 99

(56) References Cited

U.S. PATENT DOCUMENTS

| | | | |
|---|---|---|---|
| 6,114,716 A | 9/2000 | Boles et al. ................. | 257/207 |
| 6,150,197 A | 11/2000 | Boles et al. ................. | 438/128 |
| 6,486,499 B1 | 11/2002 | Krames et al. ............... | 257/81 |
| 2002/0070387 A1 * | 6/2002 | Wang et al. .................. | 257/98 |
| 2002/0070449 A1 * | 6/2002 | Yagi et al. ................... | 257/734 |
| 2003/0094622 A1 * | 5/2003 | Horiuchi et al. ............. | 257/100 |
| 2003/0222270 A1 * | 12/2003 | Uemura ....................... | 257/99 |
| 2004/0026708 A1 * | 2/2004 | Chen ........................... | 257/99 |

FOREIGN PATENT DOCUMENTS

WO   WO 99/59206   11/1999

OTHER PUBLICATIONS

U.S. Appl. No. US 2003/0085416 A1, Publication Date: May 8, 2003.

* cited by examiner

*Primary Examiner*—Ngân V. Ngô
(74) *Attorney, Agent, or Firm*—Patent Law Group LLP; Rachel V. Leiterman

(57) ABSTRACT

A device includes a submount, and a semiconductor light emitting device mounted on first and second conductive regions on a first side of the submount in a flip chip architecture configuration. The submount has third and fourth conductive regions on a second side of the submount. The third and fourth conductive regions may be used to solder the submount to structure such as a board, without the use of wire bonds. The first and third conductive regions are electrically connected by a first conductive layer and the second and fourth conductive regions are electrically connected by a second conductive layer. The first and second conductive layers may be disposed on the outside of the submount or within the submount.

25 Claims, 8 Drawing Sheets

MOUNT FOR SEMICONDUCTOR LIGHT EMITTING DEVICE

BACKGROUND

1. Field of Invention

The present invention relates to a mount for a flip-chip architecture semiconductor light emitting devices such as light emitting diodes.

2. Description of Related Art

Light emitting diodes ("LEDs") are solid-state light sources with multiple advantages. They are capable of providing light with high brightness reliably and thus find applications in displays, traffic lights, and indicators, among others. An important class of light emitting diodes is fabricated from one or more Group III elements, such as Gallium, Indium, or Aluminum, and the group V element of Nitrogen. These III-nitride LEDs are capable of emitting light across the visible spectrum and into the ultraviolet regime of the spectrum, and thus have many promising applications. Other light emitting diodes may be made from 11-phosphide and III-arsenide materials systems, which emit in the amber, red, and infrared regions of the spectrum.

Traditionally, LEDs are fabricated by depositing an n-doped region, an active region and a p-doped region on a substrate. Some LEDs have an n-contact formed on one side of the device and the p-contact is formed on the opposite side of the device, creating a vertical device. Other LEDs have both contacts formed on the same side of the device, with light extracted through the contacts. Such a structure is referred to as an epitaxy-up device. In both a vertical device and an epitaxy-up device, much of the light generated by the active region exits the device through the p-contact. Since the p-contact typically includes a metal and/or a semi-transparent metal oxide in order to optimize its electrical conduction properties, the p-contact generally transmits light poorly, posing a design problem.

Recently, a flip chip architecture has been proposed in relation to this design problem. As shown in FIG. 1, in a flip chip device 100 the die 110 is mounted on a submount 114 with the contacts facing toward the submount. Much of the light generated by the active region exits the device through the substrate, rather than the contacts. All of the electrical contacts can be positioned on the bottom of flip chip dice. The device is completed by forming the submount 114, solderable layers 118-1 and 118-2 overlying the submount, and solder balls 122-1 and 122-2 on the solderable layers, and then attaching the die 110 to the solder balls 122 to provide electrical contact for the die.

Existing designs provide a path for the current by placing wire bonds in electrical contact with the solderable layers. The wire-bonds consist of balls 126-1 and 126-2 formed on the solderable layer, and connected wires 130-1 and 130-2. The wires are then connectable to the package leads 132-1 and 132-2 of the package of the light emitting device. The submount and the die itself are attached by a die epoxy to the wiring board 134.

Wire-bonded devices have several drawbacks. First, the wire bonds are sensitive to heat. One of the limitations of the LED design is thus how much heating the wire-bonds can endure. This issue becomes more and more important as newer generations of LEDs are planned to be operated at higher power and in higher temperature environments, leading to an increase in operating temperatures and heat production. The currents in the wires heat up the wires, a process referred to as ohmic heating. The degree of the ohmic heating is determined, among other things, by the current density. Elevated temperatures and repeated thermal cycling can lead to damage to the wire bond, such as separation of the ball from the solderable layer, brittleness in the wire, or breakage in the wire caused by melting at a narrow cross section. Such heating problems can also occur in case of an electrostatic discharge ("ESD"), or during transient periods, such as switching the device on and off. Elevated temperature operation can also lead to enhanced growth of physically brittle and electrically resistive intermetallic phases at the interface between balls 126 and solderable layers 118, which can ultimately cause failure at the interface.

Second, the wire-bonds do not conduct a significant amount of heat away from the LED. Heat is generated within the LED during regular operation. Light is generated in the LED by electrons from the n-layer recombining with holes from the p-layer. Some of this recombination is radiative, leading to the emission of photons. However, a sizeable fraction of the recombination may be non-radiative, generating heat instead. In some devices, at least some of the heat generated within the device must then conducted away from the die to avoid damaging the LED. The wire-bonds have a relatively small cross-sectional area and thus do not contribute significantly to conducting heat away from the die.

Third, the wires are fragile and thus are usually the primary failure mechanism under extreme operating conditions, such as temperature shocks, rough handling, and high humidity environments. In order to protect the fragile wire-bond, the LED must be assembled in a package to be of practical use for the end users.

Fourth, wire-bonds require space on the submount outside the footprint of the LED, resulting in bigger and more expensive devices. Light emitted by the LED and incident on the large submount may be reflected from the submount, undesirably increasing the size of the light source.

Finally, wire-bonds can trap air in the package during subsequent encapsulation of the LED, creating large steps in index of refraction which may reduce the efficiency with which light is extracted from the LED die into the outside world.

SUMMARY

According to embodiments of the invention, a device includes a submount, and a semiconductor light emitting device mounted on first and second conductive regions on a first side of the submount in a flip chip architecture configuration. The submount has third and fourth conductive regions on a second side of the submount. The third and fourth conductive regions may be used to solder the submount to structure such as a board, without the use of wire-bonds. The first and third conductive regions are electrically connected by a first conductive layer and the second and fourth conductive regions are electrically connected by a second conductive layer. The first and second conductive layers may be disposed on the outside of the submount or within the submount.

DETAILED DESCRIPTION

According to embodiments of the invention, the submount on which an LED is mounted has electrical contacts on the side opposite the LED, such that the LED and submount are surface-mountable on another device, such as a board, by solder joints instead of wire bonds.

Figure 2:
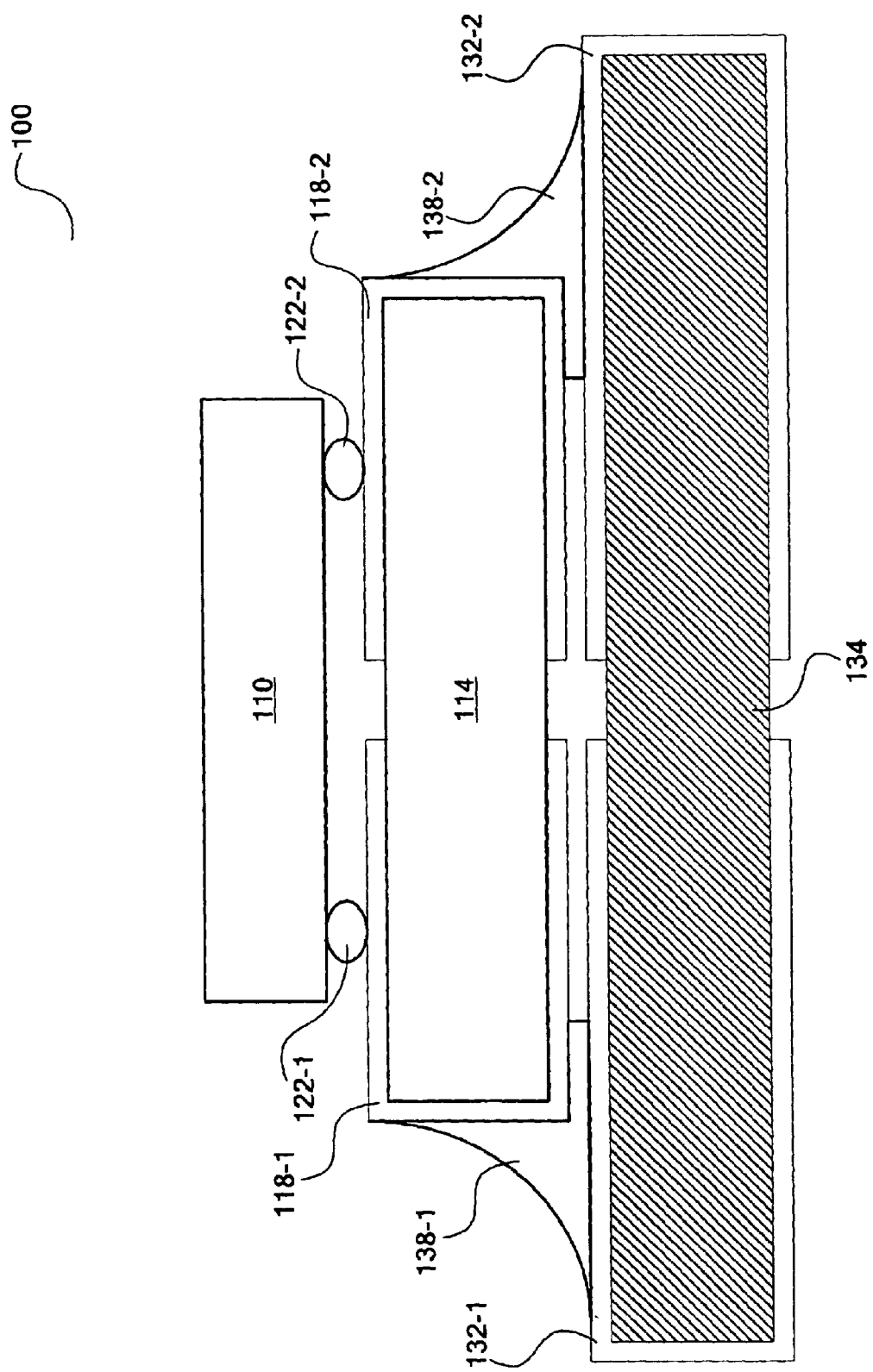
FIG. 2, illustrates an LED-submount combination connected to a board with a solder joint.

FIG. 2, illustrates an embodiment of the invention with solder joints. Electrical contacts for the die 110 of the light emitting device 100 are formed by coupling interconnects 122-1 and 122-2 to the die. Although the illustrated embodiments refer to solder balls, the interconnects may be made of elemental metals, metal alloys, semiconductor-metal alloys, solders, thermally and electrically conductive pastes or compounds (e.g., epoxies), eutectic joints (e.g., Pd-In-Pd) between dissimilar metals between the LED die and submount, Au stud-bumps, or configurations of solder besides balls, such as bars. In different embodiments the number of solder balls can be three or higher. Three solder ball designs provide a stable support for the die 100. In some embodiments the solder balls providing contact for the p-layer outnumber the solder balls providing contacts for the n-layer, for example 2 p-solder balls and 1 n-solder ball.

Figure 1:
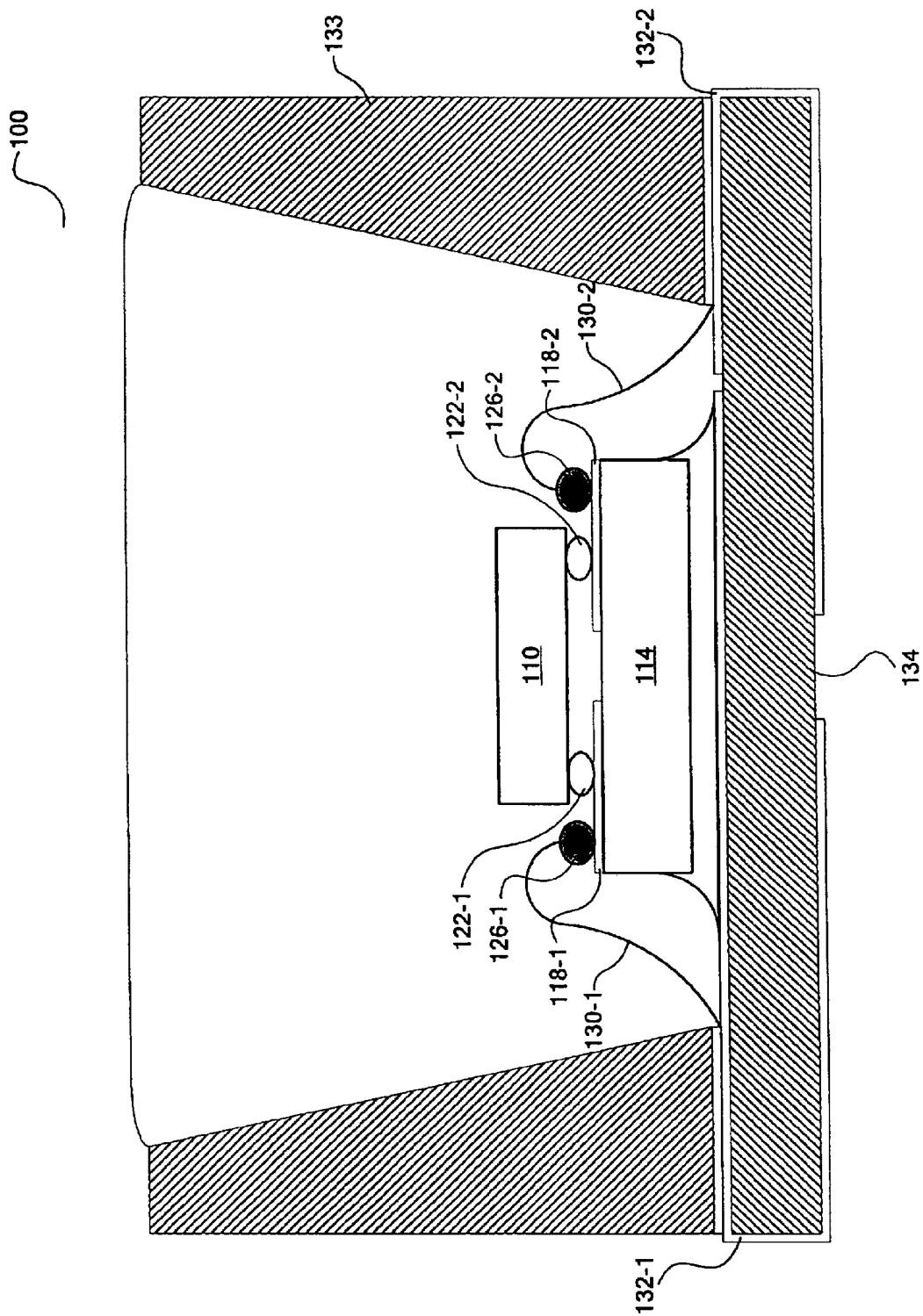
FIG. 1, illustrates an LED with wire-bonds.

The solder balls 122 are electrically coupled to conductive surfaces 118 on the surface-mountable submount 114 which may be connected to another structure by, for example, solder joints. Though in the embodiments below conductive surfaces 118 are solderable layers or surfaces and are connected to other devices by solder joints, other conductive surfaces and joints other than solder are appropriate and within the scope of the invention. The solder joints include the solderable layers 118-1 and 118-2, formed on the submount 114, and solder regions 138-1 and 138-2. In different embodiments the number of solderable layers and solders can be three or higher. The solderable layers 118 can be formed on at least two surfaces of the submount 114. In some embodiments the solderable layers cover opposite surfaces of the submount 114, such as the top and the bottom surfaces. As illustrated in FIG. 2, the solderable surfaces may extend around side surfaces of the submount, connecting the top and bottom solderable surfaces. These designs provide large solderable surfaces, to which the solders 138 can be soldered. Solders 138 may contact the solderable surfaces on just the bottom of submount 114, or may extend up the sides of submount 114 when solderable surfaces are provided on the sides of submount 114. The solders 138 are electrically coupled to the package leads 132-1 and 132-2, which are formed on a board 134 such as a printed wiring board. The package leads 132 can be formed in various ways, for example, by covering more than one surface of the wiring board. Finally, because a fraction of the photons generated in the die is emitted in directions other than through the top, one or more surfaces of submount 114 and board 134 facing LED 110 may be reflective, or reflectors similar to reflectors 133 shown in FIG. 1 may be attached to board 134. The reflectors have a reflective surface, which is positioned and shaped to redirect these photons in the preferred direction of emission, often perpendicular to the plane of the board.

The submount 114 can be formed from, for example, Si, SiC, sapphire, PCB, AlN$_x$, Al$_2$O$_3$, or any other known material used in related applications. The solder 138 can be, for example, an alloy containing Sn such as PbSn— or AgSn— binaries, ternaries, and quaternaries; an alloy containing Au such as AuSn or AuGe binaries; an alloy containing one or more of the following: In, Bi, Pb, Sb, Ag, Cu; or a metal such as Au, Ag, In, Sn, Pb; Bi, Ni, Pd, or Cu. The solderable layer 118 can be, for example, gold, silver, nickel, copper, platinum, or other materials applied in related applications. Board 134 can be formed, for example, from plastics, from ceramics such as Al$_2$O$_3$ or AlN, from composite laminates such as BN300 or FR4, or from metal boards containing Cu, Mo, Ni, or W.

The light emitting diode is coupled to the submount 114 instead of the wiring board 134 directly for several reasons. First, an ESD protection circuit can be integrated into the submount directly by, for example, standard integrated circuit fabrication techniques in the case of a Si submount. Examples of suitable ESD protection circuits include a capacitor in parallel with the LED, a single reverse-parallel diode such as a Zener or Schottky diode, and two oppositely coupled Zener diodes. Second, the submount contributes to the good light reflection of the device. Third, smaller features may be formed on a submount than on a wiring board. Smaller feature size permits positioning the solder balls close together on the submount, potentially reducing the size of the device and improving the heat extraction capabilities of the device.

Figure 3:
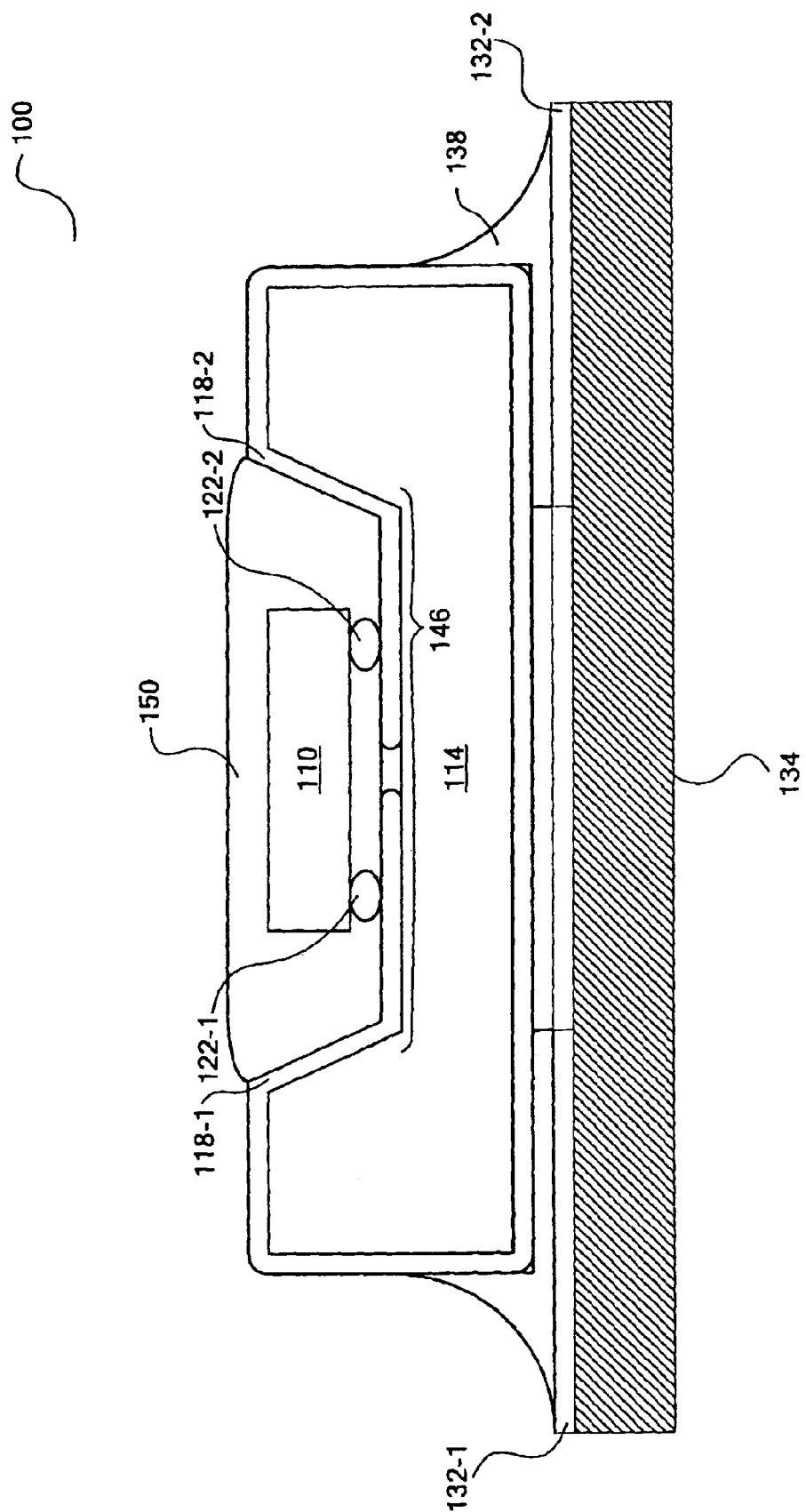
FIG. 3, illustrates an LED-submount combination with a reflecting well in the submount.

FIG. 3 illustrates another embodiment of the invention. The design on FIG. 3 is similar to the design of FIG. 2. Die 110 is electrically coupled to conductive layers 118 by solder balls 122. Solders 138 electrically and physically connect the solderable layers on the submount to the package leads 132 formed on board 134, which may be a printed wiring board.

An aspect of this embodiment is the formation of an efficient reflector. A reflective well 146 is formed as part of the submount 114. A portion of the surface of the reflective well is covered with the solderable layers 118. In some embodiments essentially the entire reflective well 146 is covered by the solderable layers 118. The solderable layers 118 are formed from materials with suitable reflectivity, so that they reflect a large portion of the incident light. Such materials include gold and silver. In some embodiments a reflective layer can be formed overlying the solderable layers 118, with particularly suitable reflective properties. The reflective well is shaped to reflect the incident light in the preferred direction of light emission. This direction is often perpendicular to the plane of the submount, but other designs are conceivable as well. The die is then positioned in the reflective well and is coupled to the solderable layers 118 by solder balls 122. The device can be embedded in an optical coupling material 150 such as, for example, epoxy or silicone. The optical coupling material 150 provides mechanical and thermal protection for the die 110. The optical coupling material can also direct the generated light into a preferred direction and couple the light out of the semiconductor layers and into the external environment efficiently.

Figure 4:
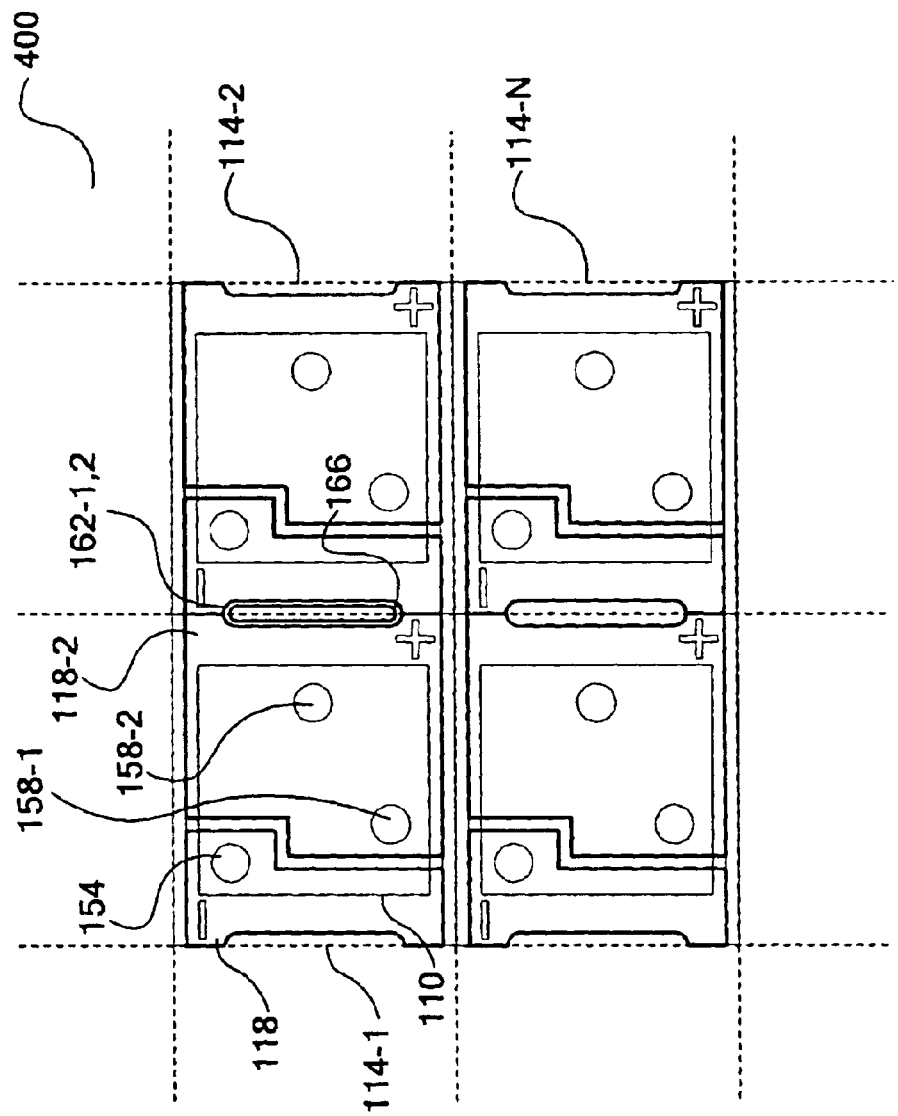
FIG. 4, illustrates a wafer of submounts with vias.

FIG. 4 illustrates a method of forming the light emitting devices of FIGS. 2 and 3. FIG. 4 illustrates the layout of an array of submounts 114 on a wafer 400, according to one embodiment of the invention from a plane view. The wafer 400 is divided into regions that will later form individual submounts 114-1 through 114-N, where N is an integer number. An n-solderable layer 118-1 is formed overlying one region of the submount 114-1, identified by the minus sign in the upper left corner of each submount. Overlying a region complementary to the n-solderable layer, a p-solderable layer 118-2 is formed on the submount 114, as identified by the plus sign in the lower right corner of each submount. The solderable layers 118 are formed to accommodate the layout of the flip chip dies 110.

The electrical coupling between the solderable layers 118 and the die 110 are provided by solder balls 122. The submounts 114 are adapted to support the solder balls 122. An n-wettable metal layer 154 is formed overlying the n-solderable layer 118-1 to support n-solder ball 122-1. P-wettable metal layers 158-1 and 158-2 are formed overlying the p-solderable layer 118-2 to support p-solder balls 122-2 and 122-3. The wettable metal layers 154 and 158 provide suitable areas for the soldering of the solder balls 122-1 through 122-3, thus creating electrical couplings between the solderable layers 118 and the die 10. In some embodiments the p-wettable metal layers 158 outnumber the n-wettable metal layers 154, because heat generated in the active region can be most efficiently extracted from the device through connections to the p-contact, thus the surface areas of these connections is often maximized. Since the active region is removed from the area on which the n-contact is formed, the p-layer and the p-wettable metal layers provide the most direct route for extracting heat from the device.

The embodiment in FIG. 4 has three solder balls. This design possesses high mechanical stability. In other embodiments more solder balls or solder bars can be employed. In addition, in the embodiment illustrated in FIG. 4, only one light emitting device is connected to each submount. In other embodiments, more than one light emitting devices, either as individual dice or as multiple devices formed in a single die, may be positioned on each submount.

The solderable layers 118 are formed in some embodiments by forming vias 162-1, 2 between neighboring submounts 114-1 and 114-2. A via can be a through hole in the wafer 400. In the present embodiment the via 162-1, 2 is formed on the boundary between the submounts 114-1 and 114-2.

In some embodiments the vias 162 are plated by forming a conductive plate layer 166 on the walls of the via 162. The plate layer 166 can be a metal layer or a highly doped semiconductor layer. In some embodiments the plate layer 166 electrically couples the solderable layer 118 on the top surface of the submount to a conductive layer on the bottom surface of the submount. Here the top surface of the submount is defined as the surface where the die 110 is coupled to the submount 114. One method of forming such vias is described in PCT publication WO 99/59206 titled "Semiconductor Device And Method For Making The Same."

Figure 5:
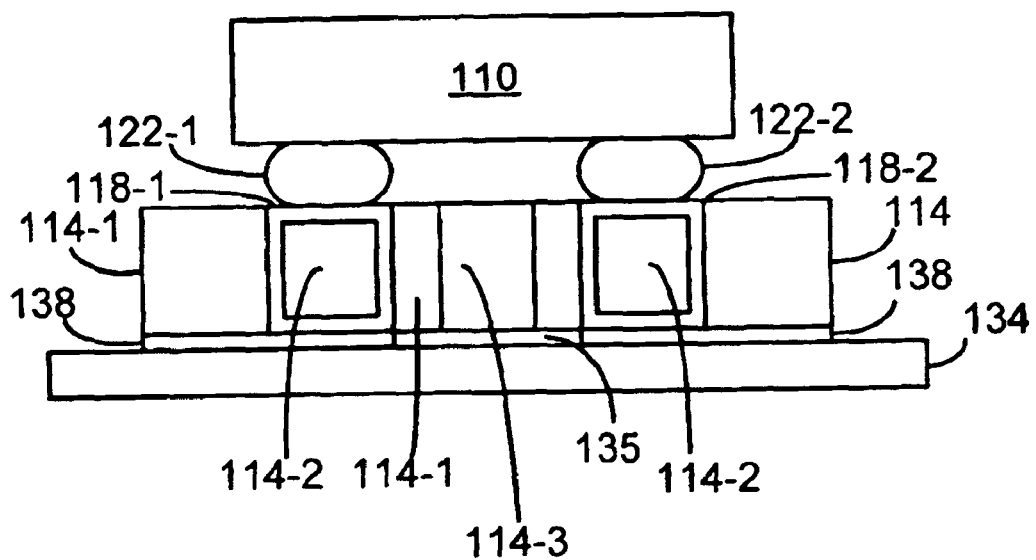
FIG. 5 illustrates an LED-submount combination with connections between the front and back submount contacts provided in vias within the submount.

FIG. 5 illustrates an embodiment of the invention where the electrical connections between the solderable surfaces on the top and bottom surfaces of the submount are formed within the submount, rather than on the outside of the submount. In the device of FIG. 5, the solderable areas on the top of the submount, on which solder balls 122-1 and 122-2 are disposed, are electrically connected to the solderable areas on the bottom of the submount, which attach to solder joint 138, by a conductive path within the submount.

Submount 114 may be, for example, a silicon/glass composite submount with several different regions. Silicon regions 114-2 are surrounded by metalizations 118-1 and 118-2, which form the conductive path between the top surface and the bottom surface of the submount. Circuitry such as ESD protection circuitry may be formed in the silicon regions 114-2 surrounded by metalizations 118-1 and 118-2, or in other silicon region 114-3. Such other silicon 114-3 regions may also electrically contact the die 110 or the board 134. Glass regions 114-1 electrically isolate different regions of silicon. Solder joints 138 may be electrically isolated by an insulating region 135 which may be, for example, a dielectric layer or air. The submount of FIG. 5 may include the integrated reflector cup illustrated in FIG. 3. Silicon/glass composite submounts are described in more detail in U.S. Pat. Nos. 6,150,197 and 6,114,716 and in published U.S. patent application 200300085416.

Figure 6A:
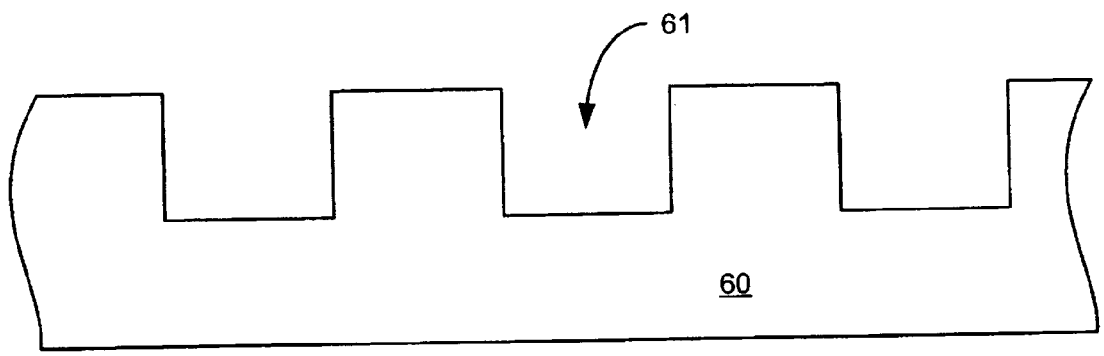
FIGS. 6A–6E illustrate a method of forming and mounting an LED on the submount of FIG. 5.
Figure 6B:
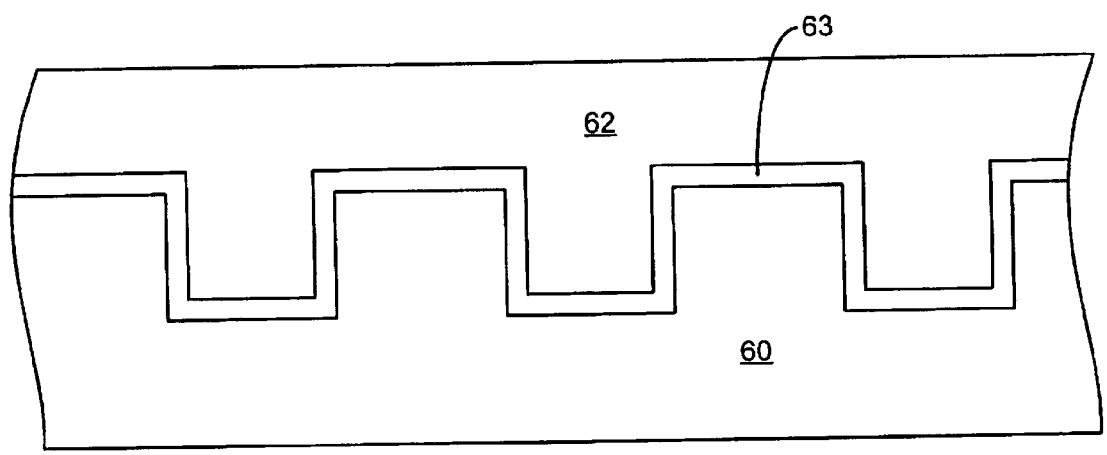

FIGS. 6A–6E illustrate the formation of and the mounting of LED dice on the submount of FIG. 5. As illustrated in FIG. 6A, a silicon wafer 60 is grown to include any desired circuitry such as the ESD protection circuitry mentioned above. Holes 61 are formed in wafer 60 by conventional masking and etching steps. A conductive layer 63, such as a metal, is formed over wafer 60 and in holes 61, as illustrated in FIG. 6B. The conductive layer 63 may then be patterned. A layer of glass 62 is then formed over wafer 60 and in holes 61.

Figure 6C:
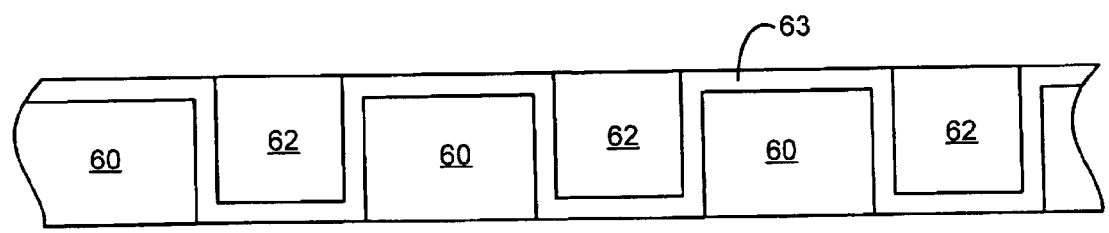
Figure 6D:
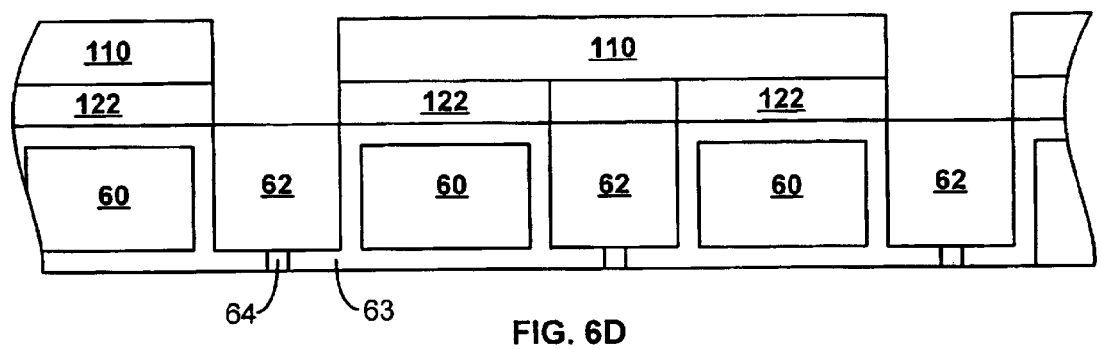

Portions of glass layer 62 and wafer 60 are removed in FIG. 6C, to expose conductive layer 63. The conductive layer 63 on the underside of the wafer may then be patterned and additional conductive layers may be added and patterned, resulting in the submount illustrated in FIG. 6D. Different conductive regions 63 may be isolated by dielectric layers 64. Once the underside of the wafer is patterned, LED dice 110 may be physically and electrically connected to the conductive regions 63 on the submount by interconnects 122.

Figure 6E:
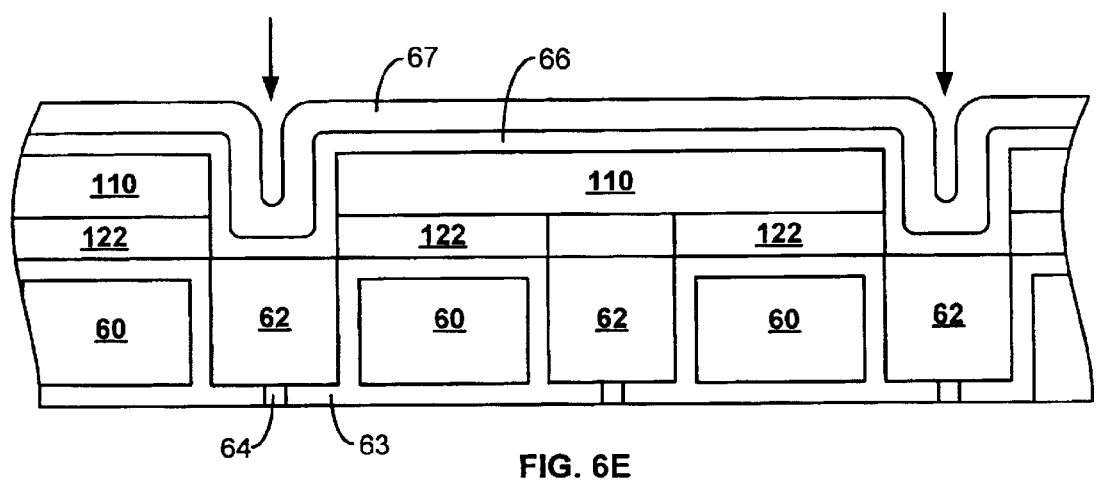

As illustrated in FIG. 6E, the mounted LED dice may then be optionally coated with a luminescent material layer 66 which includes a luminescent material such as a phosphor. Layer 66 may be applied by, for example, stenciling, screen printing, painting, electrophoretic deposition, spray painting, or electrostatic deposition. Stenciling is described in more detail in application Ser. No. 09/688,053, filed Oct. 13, 2000, and titled "Stenciling Phosphor Layers on Light Emitting Diodes." Electrophoretic deposition is described in more detail in U.S. Pat. No. 6,576,488, issued Jun. 10, 2003, and titled "Using Electrophoresis to Produce a Conformally Coated Phosphor-Converted Light Emitting Semiconductor Structure." Both applications are incorporated herein by reference. An optional coating 67 to seal or protect the luminescent material may be formed over layer 66. Optional coating may be, for example, epoxy, silicone, or spin on glass. After the desired layers are applied over the mounted LED dice, the silicon/glass composite submount may be diced into individual devices by dicing between the LEDs in the regions indicated by arrows in FIG. 6E.

Figure 7:
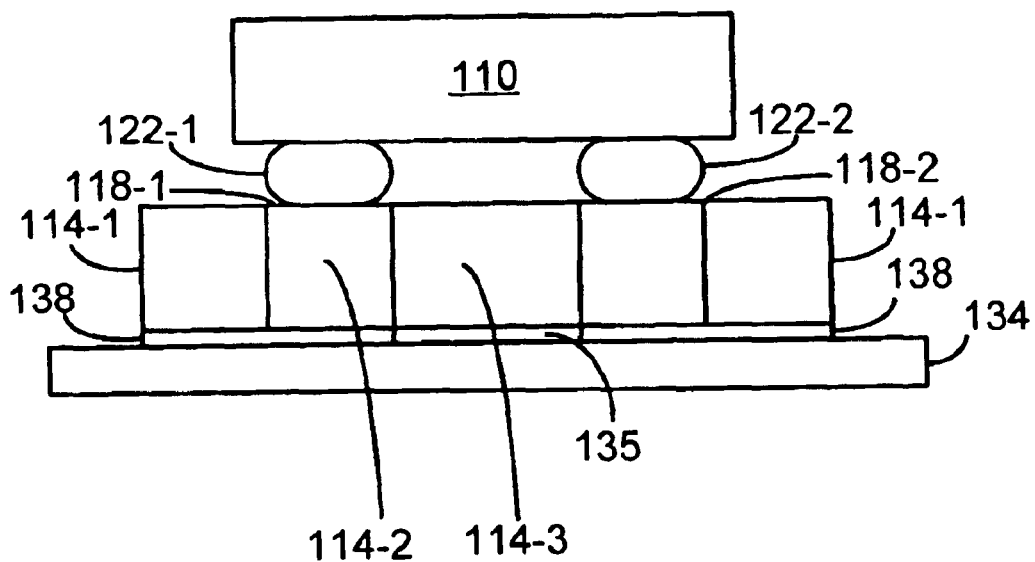
FIG. 7 illustrates an alternative embodiment of an LED-submount combination with connections between the front and back submount contacts provided in vias within the submount.

FIG. 7 illustrates an alternative embodiment of a submount with electrical connections between the solderable surfaces on the top and bottom of the submount formed within the submount, rather than on the outside of the submount. In the device of FIG. 7, the regions 114-2 of the submount under the electrical connections to the die are plugs of conductive material such as, for example, copper. The conductive plugs are electrically separated by, for example, regions of silicon 114-3 and 114-1. Circuitry such as ESD protection circuitry may be formed in silicon regions 114-1 and 114-3. The submount of FIG. 7 may include the integrated reflector cup illustrated in FIG. 3.

Figure 8A:
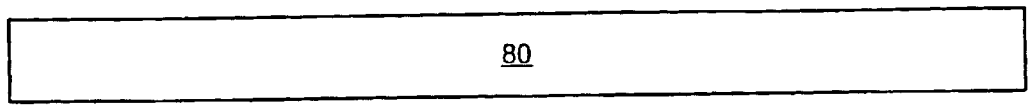
FIGS. 8A–8D illustrated a method of forming and mounting an LED on the submount of FIG. 7.
Figure 8B:
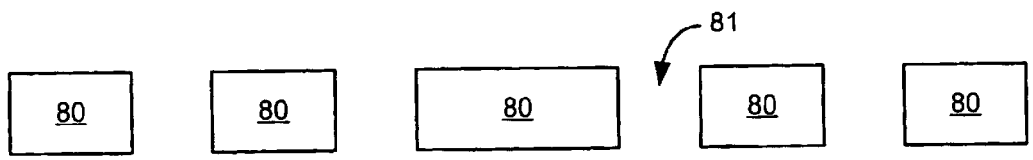
Figure 8C:
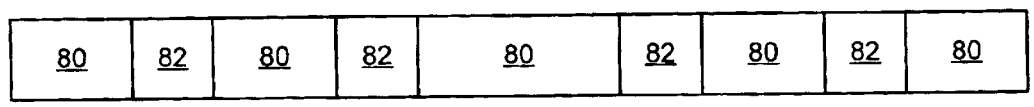
Figure 8D:
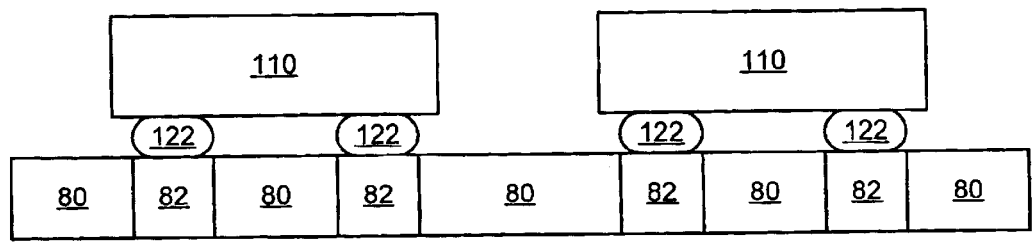

FIGS. 8A–8D illustrate the formation of and the mounting of LED dies on the submount of FIG. 7. A silicon wafer, fabricated to include desired circuitry such as the ESD protection circuitry described above, is provided in FIG. 8A. Through holes 81 are formed in wafer 80 in the regions where the conductive plugs of FIG. 7 are to be located, as illustrated in FIG. 8B. Through holes 81 are then filled with a conductive material, as illustrated in FIG. 8C. LED dice 110 may then be mounted on wafer 80. In some embodiments, conductive plugs 82 extend over the top of wafer 80 and connect directly to LED dice 110 without the use of interconnects 122.

In some embodiments of the invention, the LEDs mounted on the surface mountable submounts described above are high power devices, meaning that they operate at high current densities. A high power device may have an area greater than about 400×400 $\mu m^2$ and may operate at a current density of at least 50 A/cm$^2$. A common size for a high power device is an area greater than or equal to 1×1 mm$^2$ and electrical power consumption greater than or equal to 1 W. In such devices, the interconnects between the LED and the submount and between the submount and the device on which the submount is mounted must be carefully selected such that they will withstand the heat generated by the LED, but do not require reflow at temperatures that might damage the LED. In addition, the LED is typically mounted on the submount, then the submount is mounted on another structure in a separate step. The connection between the LED and the submount must be selected to withstand the temperature required to make the connection between the submount and the device on which the submount is mounted without failing. Examples of suitable interconnects between the LED and the submount include Au—Au interconnects, 80% Au 20% Sn solder, 88% Au 12% Ge solder, 97% Au 3% Si solder, 95% Pb 5% Sn solder, and 90% Pb 10% Sn solder, which have reflow temperatures over 500° F. Examples of suitable interconnects between the submount and the device on which the submount is mounted include Pb—Sn eutectic solder, Ag—Cu—Sn solders, and Pb—In-based solders, which have reflow temperatures under 500° F.

In some embodiments, the LEDs mounted on the surface mountable submounts described above have an area less than about 400×400 $\mu m^2$ and may operate at a current between about 5 mA and about 100 mA.

There are several advantages of LED submounts that are surface-mountable to other devices by solder connections, such as the submounts described above in FIGS. 2, 3, 5, and 7. Surface-mountable submounts have improved thermal properties, are more robust, are smaller, and are simpler to assemble than wire-bond submounts.

The solder joint between the submount and the device on which the submount is mounted may improve the thermal properties of the LED-submount combination. Commercial LEDs are typically formed from III-V materials. In the case of III-nitride devices, historically, due to the difficulty of fabricating III-nitride layers of high enough quality, the size of the device, the maximum current density tolerated by the device, and the amount of light produced by the device were very small. As fabrication techniques improved, larger devices capable of operating at higher current densities have emerged. Typically, as the amount of current provided to such devices increases, the amount of light produced by the LED desirably increases. However, as the amount of current provided to the LED increases, the amount of heat generated in the device also increases. As the temperature within a III-V LED rises, eventually failure mechanisms such as crystallographic defect migration, dark line formation, cracking of the growth substrate, cracking of the semiconductor device layers, and delamination of device contacts may be observed. Thus, the ability of a particular LED submount or package to avoid generating additional heat or to dissipate heat from the LED effectively limits the current density and thus the amount of light produced by the LED. The above-described surface-mountable submounts may improve the thermal properties of the LED-submount combination in at least two ways.

First, the large solder connections between the submount and the device on which the submount is mounted spread the current supplied to the light emitting device over larger surfaces than are possible with wire-bonds, reducing the current density in the connection. Lower current densities produce less ohmic heating. Thus, from the same materials, high power LEDs can be formed.

Second, the solder connection provides an efficient channel to conduct away the heat generated by the non-radiative recombination within the die, further reducing the operating temperature of the device. By efficiently conducting heat away from the LED, the solder joint may increase the current density at which the LED may operate, which may increase the amount of light generated by the LED. In addition, the wire-bonds themselves are susceptible to heat. The use of solder joints in place of wire bonds may reduce or eliminate various failure mechanisms associated with wire-bonds. In particular, the solder connection does not release its contacts as easily as wire-bonds, it does not become brittle, and does not melt away, causing a break in the electrical pathways.

A further advantage is that solder joints are not fragile, and are much less influenced adversely by extreme operating conditions, including humid environments, temperature shocks, and rough handling. LEDs with solder joints need not be assembled in a package as a wire-bond device, which requires the package to protect the fragile wire bonds. Rather, they can be provided to the end user in an unpackaged form, and the end users may incorporate them into their products directly, for example, by soldering them directly onto a wiring board in a specific application.

Solder joints do not require extra space for their placement, whereas wire-bonds require extra submount space. For example, each wire bond requires a circular bond pad on the submount beyond the portion of the submount covered by the LED, as well as additional submount material surrounding the circular bond pad to create a submount of a shape that is easy to dice, for example a hexagon or rectangle. Typically, each circle of space is about 150 $\mu$m in diameter. Eliminating the wire bond pads allows the formation of considerably smaller devices, or equivalently, allows the formation of a larger number of devices on a wafer of the same size, increasing the yield of the manufacturing process. In a smaller device, less light is reflected off the submount, resulting in a favorably smaller source size. In addition, smaller submounts require less silicon, which reduces the cost of the submount. In some embodiments, the submount may be smaller than the footprint of the LED mounted on the submount.

Finally, when phosphor-converted LEDs are mounted on wire-bonded submounts, the wire-bond pads on the submount are on the same side of the submount as the phosphor layer. Thus, after the phosphor is deposited over the LED, the phosphor layer must be patterned to remove the phosphor covering the wire-bond pads. In contrast, the contacts on a surface-mountable submount are on the opposite side of the submount as the phosphor layer. The use of a surface-mountable submount thus vastly simplifies the process of coating LEDs with phosphor because the phosphor layer does not need to be patterned to expose bonding pads.

The embodiments discussed above are exemplary only and are not intended to be limiting. One skilled in the art will recognize variations from the described embodiments, which are also intended to be within the scope of the invention. As such, the invention is limited only by the following claims.

What is claimed is:

1. A device comprising:
   a semiconductor light emitting device comprising:
      an n-type layer;
      a p-type layer;
      an active region interposing the n-type layer and the p-type layer;
      an n-contact electrically connected to the n-type layer; and
      a p-contact electrically connected to the p-type layer;
      wherein the n- and p-contacts are formed on a same side of the semiconductor light emitting device; and
   a submount comprising:
      first and second conductive regions on a first side of the submount;
      third and fourth conductive regions on a second side of the submount;
      a semiconductor region; and
      an insulating region, wherein the n- and p-contacts of the semiconductor light emitting device are electrically and physically connected to the first and second conductive regions of the submount in a flip chip configuration.

2. The device of claim 1 wherein the first and second conductive regions comprise a material selected from the group consisting of gold, silver, nickel, platinum, and copper.

3. The device of claim 1 wherein the first and third conductive regions are electrically connected by a first conductive layer and the second and fourth conductive regions are electrically connected by a second conductive layer.

4. The device of claim 3 wherein the first and second conductive layers are metal layers.

5. The device of claim 3 wherein the first and second conductive layers are highly doped semiconductor layers.

6. The device of claim 3 wherein the first and second conductive layers are disposed on the outside of the submount.

7. The device of claim 3 wherein the first and second conductive layers are disposed within the submount.

8. The device of claim 7 wherein the first and second conductive layers each at least partially surround a region of semiconductor material within the submount.

9. The device of claim 7 wherein the first and second conductive layers comprise copper.

10. The device of claim 1 wherein the semiconductor light emitting device is mounted in a well formed on the submount.

11. The device of claim 10 wherein at least a portion of the sides and bottom of the well are reflective to light emitted by the semiconductor light emitting device.

12. The device of claim 10 wherein the well is at least partially filled with an optical coupling material.

13. The device of claim 1 further comprising circuitry formed in the semiconductor region.

14. The device of claim 1 wherein the insulating region comprises glass.

15. The device of claim 1 further comprising:
    a board; and
    a solder joint connecting the board to the third and fourth conductive regions.

16. The device of claim 1 wherein the semiconductor light emitting device has an area greater than about 400×400 $\mu m^2$.

17. The device of claim 1 wherein the semiconductor light emitting device is capable of operating at a current density of at least 50 A/cm$^2$.

18. The device of claim 1 wherein the semiconductor light emitting device has an area greater than or equal to about 1×1 mm$^2$.

19. The device of claim 1 wherein the semiconductor light emitting device is capable of operating at an electrical power consumption greater than or equal to 1 W.

20. The device of claim 1 wherein a surface of the submount including the first and second conductive regions is free of wire-bond pads.

21. The device of claim 1 further comprising a luminescent material layer overlying a surface of the semiconductor light emitting device opposite the submount.

22. The device of claim 21 wherein the luminescent material layer overlies a side surface of the semiconductor light emitting device.

23. The device of claim 1 wherein the first, second, third, and fourth conductive regions each comprise solderable layers.

24. The device of claim 1 wherein the semiconductor light emitting device has an area less than about 400×400 $\mu m^2$.

25. The device of claim 1 wherein the semiconductor light emitting device is capable of operating at a current between about 5 mA and about 100 mA.

* * * * *